United States Patent [19]
Hirata

[11] 3,956,594
[45] May 11, 1976

[54] INDICATING CIRCUIT FOR AN FM STEREOPHONIC SIGNAL RECEIVER

[75] Inventor: Seiji Hirata, Tokyo, Japan

[73] Assignee: Sony Corporation, Tokyo, Japan

[22] Filed: Nov. 25, 1974

[21] Appl. No.: 526,817

[30] Foreign Application Priority Data
Nov. 29, 1973  Japan.............................. 48-137615

[52] U.S. Cl............................. 179/15 BT; 179/1 G
[51] Int. Cl.² ......................................... H04H 5/00
[58] Field of Search................... 325/134, 398, 455; 179/15 BT, 1 G

[56] References Cited
UNITED STATES PATENTS

| | | | |
|---|---|---|---|
| 2,712,596 | 7/1955 | Sherman.......................... | 179/15 BT |
| 3,526,838 | 9/1970 | Banick................................ | 325/455 |
| 3,569,633 | 3/1971 | Brahman......................... | 179/15 BT |
| 3,696,301 | 10/1972 | Hoshi................................. | 325/398 |

OTHER PUBLICATIONS

A Pilot Phase Monitor for FM Stereophonic Broadcasting by Dias et al., AES Preprint, Oct. 18, 1963.
The Audio Check by Shields, Electronics World, Jan. '61, pp. 56, 57.

*Primary Examiner*—Douglas W. Olms
*Attorney, Agent, or Firm*—Lewis H. Eslinger; Alvin Sinderbrand

[57] ABSTRACT

An indicating circuit for an FM stereophonic signal receiver for providing dual indications of tuning and channel balance. The indicating circuit is comprised of a tuning detecting circuit for providing a first signal admitting of a magnitude and polarity which represents the relative tuning condition of the FM receiver with respect to a received FM signal. The indicating circuit further includes respective channel level detecting circuits for providing respective signals admitting of magnitudes that represent the levels of the audio signals transmitted through the respective stereophonic signal channels of the receiver. A signal indicating meter provides indications representing the magnitudes and polarities of signals applied thereto and a switching circuit selectively supplies the output of the tuning detecting circuit or the outputs of the channel level detecting circuits to the indicating meter, whereby the relative tuning condition of the receiver as well as the channel balance of the receiver is selectively indicated.

5 Claims, 1 Drawing Figure

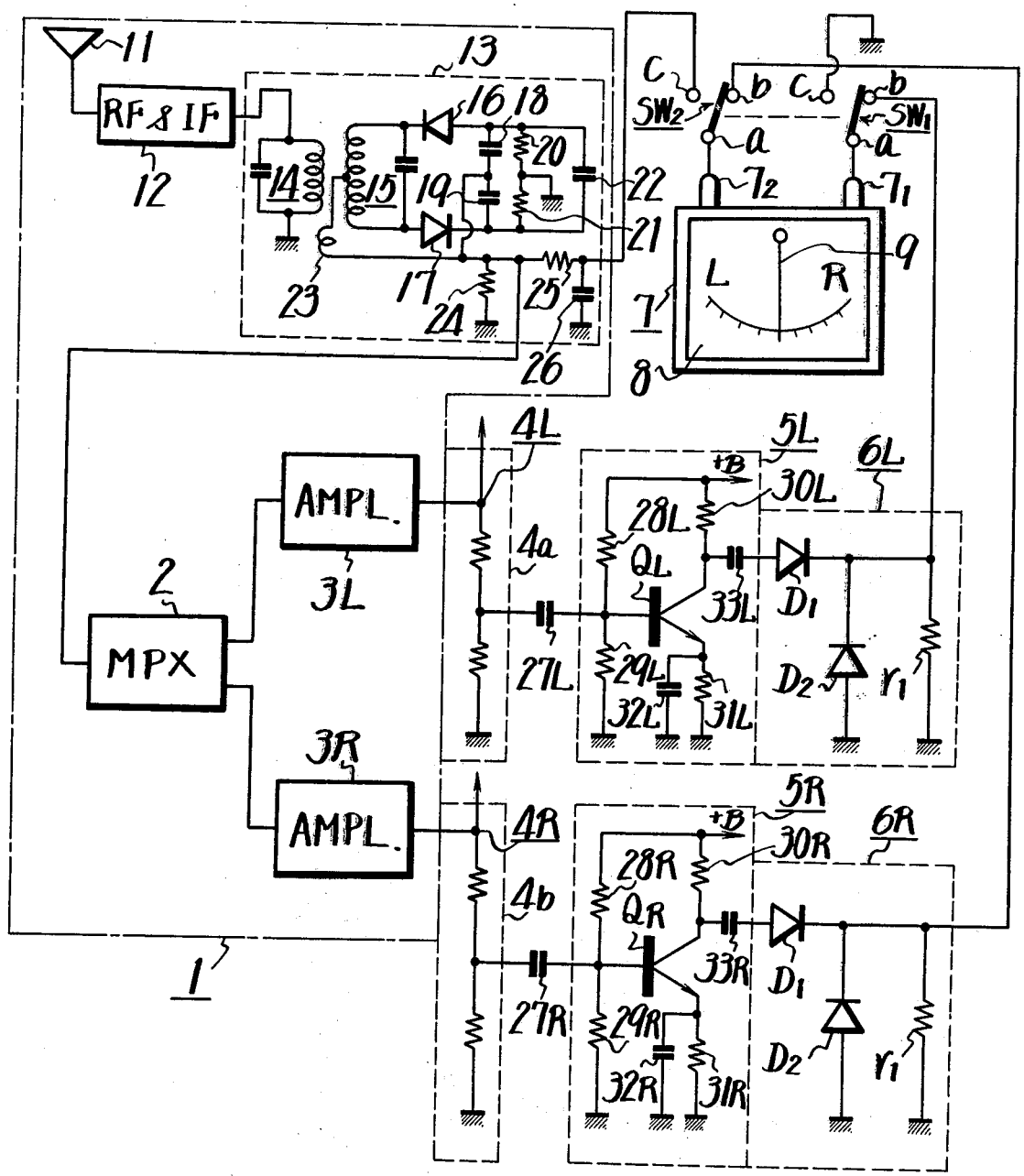

INDICATING CIRCUIT FOR AN FM STEREOPHONIC SIGNAL RECEIVER

BACKGROUND OF THE INVENTION

This invention relates to an indicating circuit for an FM stereophonic signal receiver and, in particular, to an indicating circuit capable of providing dual indications of the relative tuning of the receiver and the channel balance thereof.

Tuning indicators are conventionally employed with radio receiving equipment and especially with FM stereophonic signal receivers for enabling an operator to be apprised of the relative tuning condition of the FM receiver with respect to a received FM signal. Such tuning indicators usually are supplied with a DC voltage which is derived from the output of the frequency discriminator included in the FM receiver. Generally, such DC output admits of a magnitude which is a function of the difference between the instantaneous frequency to which the FM receiver is then tuned and the actual frequency of a received signal. The phase, or polarity, of such a DC output indicates whether the FM receiver is then tuned to a higher or lower frequency than the particular frequency of the input signal. In some receivers, the tuning indication is provided by a meter responsive to the magnitude of the aforementioned DC output, irrespective of the polarity thereof. In other receivers, the tuning meter comprises a null meter having a movable pointer that is displaced from a null position in a direction proportional to the polarity of the aforementioned DC output and by an amount which is a function of the magnitude of the DC output. When the receiver is properly tuned to a received signal, the movable pointer is disposed at a center, or null, position.

In stereophonic signal receivers having at least two audio channels (the left and right channels, for example) adjustable controls are provided to permit a listener to selectively adjust the levels of the audio signals transmitted through the respective channels. Generally, preferred sound reproduction is attained when the respective audio signals are balanced with respect to each other. To assist the listener in balancing the audio channels, a suitable indicator, such as a balance meter, is provided. Although such balance meters usually have been incorporated into stereophonic signal amplifiers, it often is preferable to include such meters in stereophonic signal tuners, especially where at least a preliminary balance operation can be performed in the tuner.

It has been found that, if a tuning meter is provided in a stereophonic signal tuner, or signal receiver, and if a balance meter is also provided therein, the attendant cost in providing two independent meters is unnecessarily high. Of course, the tuning meter and/or the balance meter can be of simple contruction to thereby reduce cost. However, such simplification should not be achieved with a resultant loss in accurate indications.

OBJECTS OF THE INVENTION

Therefore, it is an object of the present invention to provide an improved indicating circuit for an FM stereophonic signal receiver that avoids the aforenoted disadvantages.

Another object of this invention is to provide a dual indicating circuit for an FM stereophonic signal receiver which selectively provides an indication of the relative tuning of the receiver and an indication of the stereophonic signal channel balance.

Yet another object of this invention is to provide an indicating circuit for an FM stereophonic signal receiver which is relatively low in cost and provides accurate indications of both tuning and channel balance.

A further object of this invention is to provide a dual indicating circuit for an FM stereophonic signal receiver wherein a single indicating meter is selectively switched to provide a tuning indication or a channel balance indication.

Various other objects and advantages of the present invention will become apparent from the forthcoming detailed description and the novel features will be particularly pointed out in the appended claims.

SUMMARY OF THE INVENTION

In accordance with the present invention, an improved indicating circuit for an FM stereophonic signal receiver is provided wherein dual indications of tuning and channel balance are attained by a single indicating meter which provides visual indications representing the magnitudes and polarities of signals applied thereto; a tuning detector provides a first signal having magnitude and polarity representing the relative tuning condition of the receiver; respective audio channel level detectors provide respective signals having magnitude representing the levels of the respective audio signals transmitted through the signal receiver channels; and a switching circuit selectively supplies to the indicating meter either the tuning detector output or the channel level detector outputs. The single indicating meter thus provides an indication of the relative tuning condition of the receiver, or the level difference between the audio signals transmitted through the respective receiver audio channels.

BRIEF DESCRIPTION OF THE DRAWINGS

The following detailed description will best be understood in conjunction with the accompanying single FIGURE which is a partial block and partial schematic diagram of a portion of an FM stereophonic signal receiver including a dual indicator.

DETAILED DESCRIPTION OF A CERTAIN PREFERRED EMBODIMENT

Referring now to the drawing, a portion of an FM stereophonic signal receiver is illustrated in partial block and partial schematic form. An FM stereophonic signal tuner 1 is generally depicted as including an antenna 11, a radio frequency (RF) and intermediate frequency (IF) amplifier stage 12, an FM detector 13, a signal decoder 2, separate channel amplifiers 3L and 3R and an indicator 7. The RF and IF amplifier stage 12 is conventional and is connected to the antenna 11. The amplifier stage 12 is adapted to receive an FM signal and to provide an output containing the usual IF signal information. The output of the stage 12 is connected to the FM detector circuit 13. This detector comprises a conventional ratio detector having a primary tuning circuit 14 coupled to receive the IF output from the amplifier stage 12 and a secondary tuning circuit 15. As shown, the primary and secondary tuning circuits are transformer-coupled. The ratio detector is conventional in that a pair of oppositely poled diodes 16 and 17 are connected to the end terminals of the secondary tuning circuit 15, the diodes being further interconnected by series-connected capacitors 18 and 19. Series-connected resistors 20 and 21 are connected in parallel with the capacitors 18 and 19 and, in addition, a capacitor 22 is connected in parallel with the series-connected resistors. The ratio detector further includes tertiary winding 23 connected to a center tap of the secondary tuning circuit 15 and coupled to the junction defined by the series-connected capacitors 18 and 19, as is conventional. It is appreciated that the ratio detector 13 operates to demodulate the frequency modulated IF signal supplied thereto by the amplifier stage 12 to produce audio frequency information signals at the output terminal defined by the junction formed of the series-connected capacitors 18 and 19. When the tuner 1 is properly tuned to a received FM signal, such as a predetermined broadcast frequency, the usual stereophonic audio information signals are produced at the output of the ratio detector. This ratio detector output terminal is, therefore, coupled to a reference potential, such as ground, by a resistor 24. Hence, the output of the ratio detector is developed across the output resistor 24.

In addition, the ratio detector output terminal is connected through a low-pass filter formed of a series-connected resistor 25 and a shunt capacitor 26 to the indicating meter 7 by a switching circuit, to be described. As is characteristic of conventional ratio dectectors, the DC output voltage produced at the output terminal thereof is substantially reduced to a zero, or null, value when the tuner 1 is properly tuned to a received FM signal. However, in an out-of-tune condition, a DC voltage is produced having a magnitude which is a function of the degree of mistuning i.e., the difference between the signal to which the tuner is then tuned and the actual FM signal received thereby, and a phase, or polarity, which indicates whether the tuner is tuned above or below the proper frequency. The low-pass filter formed of resistor 25 and capacitor 26 is adapted to supply this DC voltage to the indicating meter 7.

The output terminal of the ratio detector is further connected to the audio signal decoder circuit 2 which comprises a conventional multiplex decoder. The stereophonic multiplex decoder is adapted to separate the audio signal information produced by the ratio detector into respective audio channels. For example, in the particular embodiment illustrated herein, the sterophonic signal receiver is provided with left and right audio channels. Accordingly, the multiplex decoder 2 is adapted to separate the received audio signal information into respective left and right channel audio signals. The corresponding outputs of the multiplex decoder 2 are connected to the left channel preamplifier 3L and the right channel preamplifier 3R, which are conventional.

The respective audio channel preamplifiers 3L and 3R are illustrated as being connected to channel level detecting circuits which are substantially identical. Each of the channel level detecting circuits is adapted to produce an output signal having a magnitude which is a function of the signal level of the audio signal produced by the corresponding preamplifier 3L, 3R. In addition, these audio channel preamplifiers are connected to further apparatus, not shown, as indicated by the illustrated arrows. Turning now to the channel level detecting circuits, the left channel level detecting circuit is comprised of a signal attenuator 4a, an amplifier circuit 5L and a rectifier circuit 6L. The right channel level detecting circuit is similarly comprised of a signal attenuator 4b, an amplifier circuit 5R and a rectifier circuit 6R. In the interest of brevity, and since the left and right channel level detecting circuits are seen to be substantially identical, only the left channel level detecting circuit will be described in detail.

The signal attenuator 4a is a conventional resistance divider network adapted to attenuate the signal level of the audio output of the left channel preamplifier 3L. This attenuator is connected, by a coupling capacitor 27L, to the amplifier circuit 5L formed of a transistor QL. The transistor is disposed in common-emitter configuration whereby bias resistors 28L and 29L are connected across a power supply +B to derive a bias potential which is supplied to the base electrode of the amplifying transistor QL. The collector electrode is connected to a load resistor 30L, and the emitter electrode is coupled to ground by a negative feedback resistor 31L which is connected in parallel with a by-pass capacitor 32L. The amplified output derived from the amplifier circuit 5L is provided at the collector electrode of the transistor QL which, in turn, is connected by the coupling capacitor 33L, to the rectifier circuit 6L. The rectifier circuit is formed of diodes D1 and D2, poled so that only a positive unidirectional signal is derived. An output resistor rl is connected in parallel with the diode D2, the common junction formed thereby being coupled to the indicating meter 7 by a switching network, to be described.

The right channel level detecting circuit is substantially identical to the channel level detecting circuit just described, and the output of the rectifier circuit 6R is coupled to the indicating meter 7 by the aforenoted switching network.

In one embodiment of the present invention, the indicating meter 7 comprises a conventional null meter having an indication surface 8 and a movable pointer 9 that is pivotally displaced in a direction proportional to the magnitude and polarity of signals applied to the meter 7. In particular, the null meter includes first and second input terminals $7_1$ and $7_2$ adapted to receive input signals. The pointer 9 is displaced in accordance with the difference between the input signals applied to the input terminals $7_1$ and $7_2$. For example, if the magnitude of the signal applied to the input terminal $7_2$ exceeds the magnitude of the input signal applied to the input terminal $7_1$, the pointer 9 is displaced in a clockwise direction, as the drawing is viewed, so as to be moved from the center, or null position toward the indication "L". Of course, an opposite movement results if the signal applied to the input terminal $7_1$ exceeds the signal applied to the input terminal $7_2$.

The switching network for selectively supplying the tuning detecting output signal and the audio channel level detecting signals to the indicating meter 7 is illustrated as comprising a pair of switches SW1 and SW2. Each of these switches is formed of a movable contact $a$ connected to a respective meter input terminal $7_1$ and $7_2$, respectively, and a pair of stationary contacts $b$ and $c$. The movable contacts of the respective switches SW1 and SW2 are ganged for simultaneous operation so that both movable contacts may be disposed to selectively engage their respective contacts $b$ or $c$, as desired. Accordingly, the switches may comprise conventional double-pole double-throw type change-over switches. As shown, the contact $b$ of switch SW1 is connected to the output of the rectifier circuit 6L and the contact $b$ of switch SW2 is connected to the output of the rectifier circuit 6R. Alternatively, opposite connections to these stationary switch contacts can be provided. The contact $c$ of the switch SW1 is connected to ground and the contact $c$ of the switch SW2 is connected to the low-pass filter formed of the resistor 25 and the capacitor 26.

The operation of the illustrated apparatus to provide the dual indications of relative tuning and channel balance will now be described. Let it initially be assumed that the switches SW1 and SW2 are operated such that their respective movable contacts $a$ are disposed to contact the stationary contacts $c$. In this selective configuration, ground potential is applied to the meter input terminal $7_1$ and the output terminal of the ratio detector 13 is coupled, through the low-pass filter, to the meter input terminal $7_2$. Now, as the tuner 1 is tuned to a received broadcast frequency, the frequency of the IF signal applied to the ratior detector 13 will differ from the predetermined IF frequency of 10.7MHz which is attained when the tuner is properly tuned. As is known, when the frequency of the IF signal differs from this predetermined frequency, the low-pass filter formed of the resistor 25 and the capacitor 26 supplies the meter input terminal $7_2$ with a DC voltage. The phase, or polarity, of this DC voltage is a function of whether the tuner is then tuned to a frequency which is above or below the predetermined IF frequency. Since the meter input terminal $7_1$ is supplied with ground potential, it is seen that the effective voltage applied to the meter is equal to the DC voltage derived from the ratio detector output, that is, the voltage difference between the meter input terminals merely is equal to the voltage applied to the input terminal $7_2$.

As the tuner is tuned to the proper broadcast frequency, the magnitude of the DC voltage applied to the meter input terminal $7_2$ decreases to thereby reduce the displacement of the pointer 9. Finally, when the frequency to which the tuner is then tuned is equal to the frequency of an actually received signal, the IF signal output admits of the predetermined 10.7MHz frequency and the DC voltage derived from the ratio detector output is reduced to a zero, or null, value. Consequently, the meter 7 provides a null indication whereby the movable pointer 9 is positioned at its center, or null, location.

Let it now be assumed that the ganged switches SW1 and SW2 are changed over such that their respective movable contacts $a$ engage the stationary contacts $b$. In this selective configuration, the DC output produced by the left channel rectifier circuit 6L, which is representative of the level of the audio signal amplified by the preamplifier 3L, is supplied to the meter input terminal $7_1$. Similarly, the DC voltage produced by the right channel rectifier circuit 6R, which is representative of the level of the audio signal amplified by the preamplifier 3R, is supplied to the meter input terminal $7_2$. The effective voltage applied to the meter 7 is thus equal to the difference between the voltages applied to the respective meter input terminals. If the voltage applied to the input terminal $7_1$ exceeds the voltage applied to the input terminal $7_2$, that is, the left channel signal level exceeds the right channel signal level, the resultant, or net voltage across the meter causes the movable pointer 9 to be displaced toward the designation "L". A listener is thus provided with a visual indication of the unbalance condition of the audio channels and may adjust suitable control elements, not shown, to restore a preferred balance. Conversely, if the DC voltage applied to the meter input terminal $7_2$ exceeds the DC voltage applied to the meter input terminal $7_1$, that is, if the right channel signal level is greater than the left channel signal level, the effective voltage applied across the meter causes the movable pointer 9 to be displaced toward the designation "R". This unbalance condition can thus be visually observed by a listener. It is seen that, when the left and right channels are balanced, each meter input terminal is supplied with the same DC voltage level and the movable pointer 9 is located at its center, or null, position.

The change-over switches SW1 and SW2 may be of conventional mechanical construction whereby their respective movable contacts $a$ are locked in selective engagement with either contacts $b$ or contacts $c$, depending upon the manual operation of the switches. Alternatively, the change-over switches may be of the non-locking type which, additionally, may be spring-biased so that the respective movable contacts $a$ are normally engaged with one of the contacts $b$ or $c$ and will be switched into engagement with the other of the stationary contacts when manually operated. For example, if these switches are of the push-button type, the movable contact $a$ normally may be in engagement with the contact $b$ until the push-button is depressed, at which time the movable contact will engage the stationary contact $c$. Upon releasing the push-button, the movable contact is restored to its normal engagement with the stationary contact $b$.

While the present invention has been described with respect to a certain preferred embodiment thereof, it should be appreciated that various changes and modifications in form and detailes can be made. For example, the meter 7 may include a single input terminal coupled to an algebraic combining circuit adapted to be supplied with signals selectively applied thereto by the switches SW1 and SW2. As a further alternative, the meter 7 may be of the type which includes an internal DC conversion circuit, thereby obviating the rectifier circuits 6L and 6R. As yet another embodiment, a "tuned" indication may be provided by a maximum deflection of the movable pointer 9, rather than a null indication. This can be readily attained by providing, for example, a differencing network supplied with the DC voltage derived from the ratio detector, which is to be subtracted from a predetermined reference voltage. In this alternative embodiment, when the derived DC voltage is zero, representing a "tuned" condition, a maximum voltage is applied to the meter 7. Conversely, for an "untuned" condition, a minimum voltage is applied to the meter. Of course, various other embodiments of this nature can be envisaged. Therefore, the appended claims are to be understood as including the foregoing as well as other such changes and modifications.

What is claimed is:

1. An indicating circuit for an FM stereophonic signal receiver for providing dual indications of tuning and channel balance, comprising:
   tuning detecting means for providing a first signal having magnitude and polarity representing the relative tuning condition of said receiver with respect to a received FM signal;
   first channel level detecting means for providing a second signal having magnitude representing the level of an audio signal transmitted in a first signal channel of said signal receiver;
   second channel level detecting means for providing a third signal having magnitude representing the level of an audio signal transmitted in a second signal channel of said signal receiver;

a null meter having a movable pointer that is displaced proportional to the magnitude and in a direction proportional to the polarity of a signal applied thereto; and switch means for selectively supplying said first signal and said second and third signals to said null meter; whereby the relative tuning condition of said receiver is indicated, and the level difference between the audio signals transmitted in said first and second channels is indicated.

2. An indicating circuit in accordance with claim 1 wherein said tuning detecting means comprises low pass filter means connected to an output terminal of a frequency discriminator included in said signal receiver for producing a first DC signal having magnitude and polarity that is a function of the difference between the frequency to which said signal receiver is then tuned and the frequency of the signal actually received thereby, said low pass filter means being further coupled to said indicating means by said switch means to selectively supply said first DC signal to said indicating means.

3. An indicating circuit in accordance with claim 2 wherein each of said channel level detecting means comprises DC signal generating means for generating second and third DC signals, respectively, having magnitudes proportional to the audio signals transmitted in said first and second signal channels, respectively, each of said DC signal generating means being further coupled to said null meter by said switch means, whereby said null meter provides an indication that is a function of the difference between said second and third DC signals.

4. An indicating circuit in accordance with claim 3 wherein said null meter includes first and second input terminals and said movable pointer is displaced in accordance with the difference between DC signals applied to said first and second input terminals; and wherein said switch means comprises first and second ganged switching elements coupled to said first and second input terminals, respectively, and operable in a first condition to apply said first DC signal and a reference signal to said first and second input terminals and in a second condition to apply said second and third DC signals to said first and second input terminals.

5. An indicating circuit in accordance with claim 4 wherein the respective DC signal generating means comprise an amplifier supplied with decoded audio signals and a rectifier circuit coupled to said amplifier and having an output connected to a respective one of said first and second switching elements.

* * * * *